(12) United States Patent
Niel et al.

(10) Patent No.: US 8,426,973 B2
(45) Date of Patent: Apr. 23, 2013

(54) INTEGRATED CIRCUIT OF DECREASED SIZE

(75) Inventors: Stephan Niel, Greasque (FR); Jean-Michel Mirabel, Cabries (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 287 days.

(21) Appl. No.: 12/538,313

(22) Filed: Aug. 10, 2009

(65) Prior Publication Data
US 2010/0044874 A1 Feb. 25, 2010

(30) Foreign Application Priority Data

Aug. 19, 2008 (FR) ..................... 08/55614

(51) Int. Cl.
*H01L 23/52* (2006.01)
*H01L 21/4763* (2006.01)

(52) U.S. Cl.
USPC ............ 257/773; 257/E23.141; 257/E21.495; 438/618; 438/622; 438/642; 438/685; 438/688

(58) Field of Classification Search .................. 438/618, 438/620, 638, 666, 668, 688; 257/775
See application file for complete search history.

(56) References Cited

U.S. PATENT DOCUMENTS

| | | | | |
|---|---|---|---|---|
| 6,255,151 B1 * | 7/2001 | Fukuda et al. | ................. | 438/197 |
| 6,429,474 B1 * | 8/2002 | Gambino et al. | ............. | 257/296 |
| 6,433,428 B1 | 8/2002 | Watanabe et al. | | |
| 6,815,328 B2 * | 11/2004 | Pio | ........................ | 438/618 |
| 6,869,872 B2 * | 3/2005 | Suh | ........................ | 438/626 |
| 2002/0072223 A1 * | 6/2002 | Gilbert et al. | ................. | 438/629 |
| 2005/0151264 A1 | 7/2005 | Saito et al. | | |
| 2006/0125024 A1 | 6/2006 | Ishigaki | | |
| 2006/0220003 A1 | 10/2006 | Noguchi et al. | | |
| 2006/0237851 A1 * | 10/2006 | Ko et al. | ...................... | 257/774 |

OTHER PUBLICATIONS

French Search Report dated Feb. 3, 2009 from French Patent Application No. 08/55614.

* cited by examiner

*Primary Examiner* — Angel Roman
(74) *Attorney, Agent, or Firm* — Wolf, Greenfield & Sacks, P.C.

(57) ABSTRACT

An integrated circuit including an insulating layer having first and second opposite surfaces. The circuit includes, in a first area, first conductive portions of a first conductive material, located in the insulating layer, flush with the first surface and continued by first vias of the first conductive material, of smaller cross-section and connecting the first conductive portions to the second surface. The circuit further includes, in a second area, second conductive portions of a second material different from the first conductive material and arranged on the first surface and second vias of the first conductive material, in contact with the second conductive portions and extending from the first surface to the second surface.

8 Claims, 4 Drawing Sheets

INTEGRATED CIRCUIT OF DECREASED SIZE

CROSS REFERENCE TO RELATED APPLICATIONS

This application claims the priority benefit of French patent application number 08/55614, filed on Aug. 19, 2008, entitled "INTEGRATED CIRCUIT OF DECREASED SIZE," which is hereby incorporated by reference to the maximum extent allowable by law.

BACKGROUND OF THE INVENTION

1. Field of the Invention

The present invention relates to integrated circuits and to integrated circuit manufacturing methods. More specifically, the present invention relates to the structure of the metal tracks of integrated circuits.

2. Discussion of the Related Art

Integrated circuit design rules impose minimum distances for the elements of an integrated circuit and minimum intervals between the integrated circuit elements, especially the metal tracks which extend between insulating layers and/or at the surface of an insulating layer and conductive vias which generally extend through insulating layers. A metal track may have any shape and, in particular, may correspond to a metal pad with a square or rectangular base. The minimum track dimension may be defined as the smallest track dimension that can be used, apart from the thickness. The minimum track dimension especially depends on the techniques implemented in the integrated circuit manufacturing.

The current tendency is to decrease the dimensions of integrated circuits. For certain integrated circuits, the dimensions of the metal tracks defined on design of the integrated circuit define the final dimensions of the integrated circuit. Such may be the case for metal tracks of the first metallization level of the non-volatile ROMs (read-only memories) which are programmed on manufacturing or at the first use of the integrated circuit and which can be neither erased, nor reprogrammed afterwards. Indeed, in this case, the tracks of the first metallization level at least partly correspond to pads and the step of the pads define the size of the memory.

Among conventional methods for manufacturing metal tracks of an integrated circuit, methods with aluminum-copper tracks for which all the integrated circuit tracks are based on an alloy containing aluminum and a small amount of copper, and methods with copper tracks, for which all the integrated circuit tracks are made of copper can be distinguished. In the following description, expression "aluminum track" indifferently means a track made of aluminum only or based on an alloy of aluminum and of a small amount of one or of several other materials, for example, copper.

The minimum dimension to be provided for an aluminum track is greater than the minimum dimension to be provided for a copper track due to the techniques implemented in the forming of aluminum tracks. Thereby, when the final dimensions of an integrated circuit are imposed by the dimensions of the metal tracks of the first metallization levels, the implementation of a copper track method instead of an aluminum-copper track method enables to decrease the integrated circuit dimensions. However, the implementation cost of a copper track method is greater than the implementation cost of an aluminum-copper track method, which limits the use thereof.

SUMMARY OF THE INVENTION

An object of an embodiment of the present invention is an integrated circuit comprising a specific conductive track structure enabling to obtain an integrated circuit having dimensions smaller than the dimensions of a circuit obtained by an aluminum-copper track method and having a manufacturing cost lower than the manufacturing cost of an integrated circuit obtained by a copper track method.

Another object of an embodiment of the present invention is a method for manufacturing conductive tracks of an integrated circuit enabling to obtain an integrated circuit having dimensions smaller than the dimensions of a circuit obtained by a method with aluminum-copper tracks, with a less expensive implementation than a copper track method.

Thus, an embodiment of the present invention provides an integrated circuit comprising an insulating layer having first and second opposite surfaces. The circuit comprises, in a first area, first conductive portion of a first conductive material, located in the insulating layer, flush with the first surface and continued by first vias of the first conductive material, of smaller cross-section and connecting the first conductive portions to the second surface. The circuit comprises, in a second area, second conductive portion of a second conductive material different from the first conductive material and arranged on the first surface and second vias of the first conductive material, in contact with the second conductive portions and extending from the first surface to the second surface.

According to an embodiment of the present invention, the minimum dimension parallel to the first surface of the first conductive portions is smaller than the minimum dimension parallel to the first surface of the second conductive portions.

According to an embodiment of the present invention, the first vias have a first length and the second vias have a second length greater than the first length.

According to an embodiment of the present invention, the circuit further comprises an additional insulating layer comprising third and fourth opposite surfaces and covering, on the third surface side, the first and second conductive portions and the insulating layer; third vias having a third length and extending from the fourth surface to the third surface in contact with the first conductive portions; and fourth vias having a fourth length strictly smaller than the third length and connecting the second conductive portions to the fourth surface.

According to an embodiment of the present invention, the first conductive material is made with a tungsten basis.

According to an embodiment of the present invention, the second conductive material is made with an aluminum basis.

According to an embodiment of the present invention, the first area corresponds to a ROM-type non-volatile memory area.

According to an embodiment of the present invention, the circuit comprises a substrate and said insulating layer covers the substrate on the side of the second surface.

An embodiment of the present invention aims at a method for manufacturing an integrated circuit comprising the steps of providing an insulating layer having first and second opposite surfaces; forming, in a first area of the integrated circuit, first conductive portions of a first conductive material, located in the insulating layer, leveling the first surface and continued by first vias of the first conductive material, of smaller cross-section and connecting the first conductive portions to the second surface; and forming, in a second area of the integrated circuit, second conductive portions of a second conductive material different from the first conductive material and arranged on the first surface and second vias of the first conductive material, in contact with the second conductive portions and extending from the first to the second surface.

According to an embodiment of the present invention, the method comprises the steps of forming in the first surface of the insulating layer first openings having the dimensions of the first conductive portions and extending across a portion of the thickness of the insulating layer; forming in the insulating layer second openings having the dimensions of the first vias and extending form the first openings to the second surface; forming in the insulating layer third openings having the dimensions of the second vias and extending form the first surface to the second surface; and filling the first, second, and third openings with the first material.

The foregoing objects, features, and advantages of the present invention will be discussed in detail in the following non-limiting description of specific embodiments in connection with the accompanying drawings.

DETAILED DESCRIPTION

Figure 1:
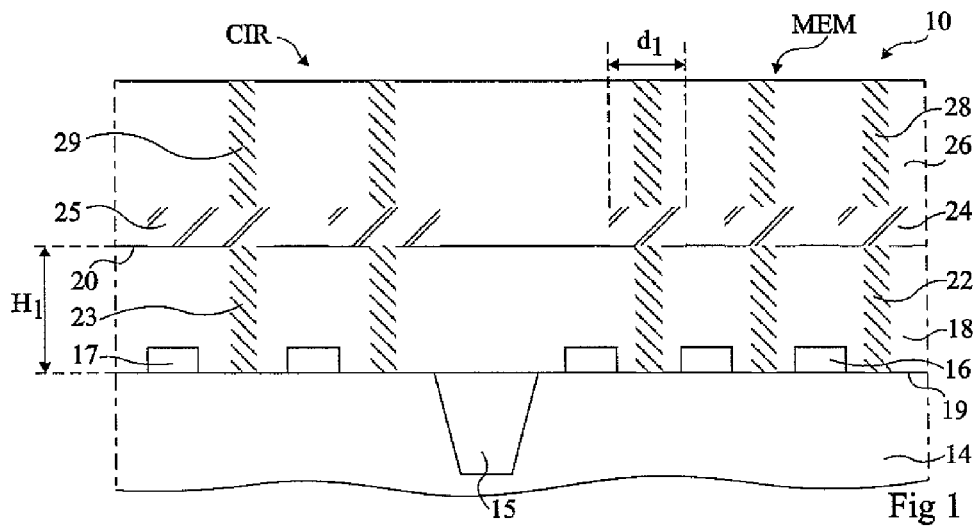
FIGS. 1 to 3 respectively are cross-section views of two embodiments of conventional integrated circuits and of an embodiment of an integrated circuit according to the present invention.

For clarity, the same elements have been designated with the same reference numerals in the different drawings and, further, as usual in the representation of integrated circuits, the various drawings are not to scale.

Figure 2:
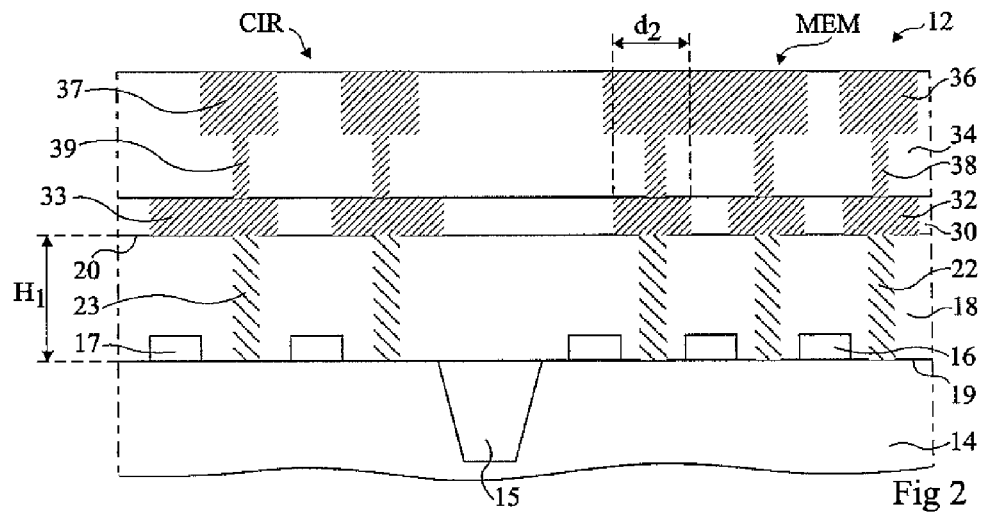

FIGS. 1 and 2 are cross-section views of examples of conventional integrated circuits 10, 12. As an example, each integrated circuit 10, 12 comprises a first area corresponding to a memory MEM, for example, a ROM, schematically shown on the right-hand side of the drawings, and a second area called auxiliary circuit CIR, schematically shown on the left-hand side of the drawings. Generally, auxiliary circuit CIR comprises all the integrated circuit components which are not part of memory MEM. The conductive tracks and vias of integrated circuit 10 are obtained by a method with aluminum-copper tracks while the conductive tracks and vias of integrated circuit 12 are obtained by a method with copper tracks.

Each integrated circuit 10, 12 comprises a substrate 14 of a semiconductor material, for example, single-crystal silicon. An insulation region 15, for example, a silicon oxide region formed by an STI-type process (shallow trench isolation), separates memory MEM from auxiliary circuit CIR. Electronic components, for example, MOS transistors, are provided in and on substrate 14. Only portions of a semiconductor material 16, 17, for example, polysilicon, arranged on substrate 14, have been shown. Substrate 14 and semiconductor portions 16, 17 are covered with an insulating layer 18, of thickness $H_1$, for example a silicon oxide layer. Layer 18 comprises a surface 19 in contact with substrate 14 and a surface 20 opposite to surface 19. Conductive vias 22, 23, for example made of tungsten, cross insulating layer 18 and come into contact with substrate 14 and/or semiconductor portions 16, 17.

For circuit 10, aluminum tracks 24, 25 of a first metallization level are arranged on insulating layer 18. When memory MEM is a non-volatile ROM, tracks 24 may partly have the shape of pads and take part in the programming of memory MEM. Call d1 the smallest dimension (other than the thickness) of tracks 24. An insulating layer 26 covers tracks 24, 25 and insulating layer 18. Conductive vias 28, 29, for example, made of tungsten, cross insulating layer 26 and come into contact with conductive tracks 24, 25. Metal tracks, not shown, of upper metallization levels may be provided. In particular, the metal tracks of the last metallization level(s) may be made of aluminum or possibly of copper.

For circuit 12, an insulating layer 30 covers layer 18. Copper tracks 32, 33 of a first metallization level are located in insulating layer 30 in contact with vias 22, 23. Tracks 32 on the side of memory MEM may have the shape of pads. Call $d_2$ the smallest dimension of tracks 32 other than the thickness. An insulating layer 34 covers insulating layer 30 and tracks 32, 33. Copper tracks 36, 37 of a second metallization level are provided in insulating layer 34 at the surface thereof and extend in vias 38, 39 which come into contact with tracks 32, 33.

Figure 3:
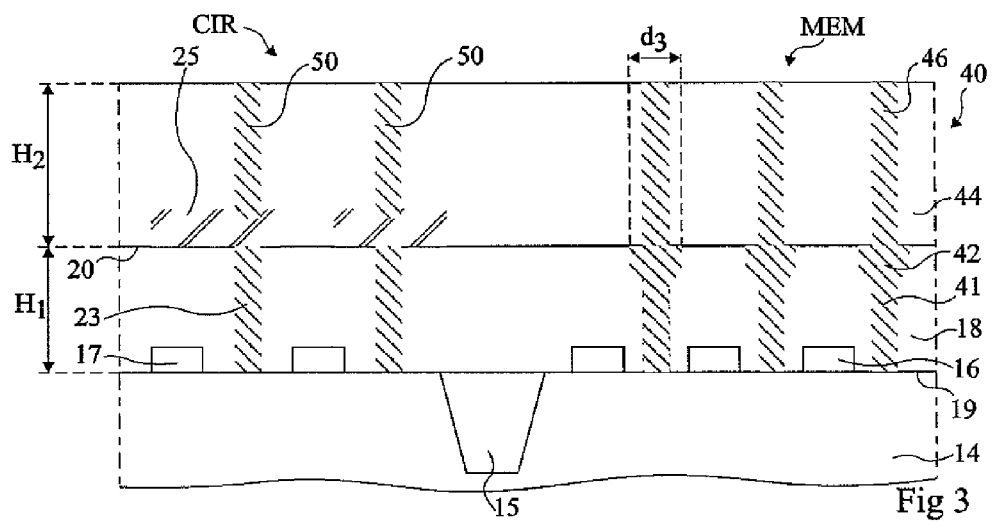

FIG. 3 shows an embodiment of an integrated circuit 40 according to the present invention. For auxiliary circuit CIR, circuit 40 has a structure similar to circuit 10. In particular, conductive via 23 extends across the entire thickness $H_1$ of insulating layer 18 and aluminum metal tracks 25 rest upon insulating layer 18 in contact with vias 23. On the side of memory MEM, integrated circuit 40 comprises vias 41 made of a conductive material, for example, tungsten, which extend only across part of thickness $H_1$ of insulating layer 18. Circuit 40 further comprises conductive tracks 42, of the same material as vias 41, which extend in insulating layer 18 flush with the surface of insulating layer 18 and come into contact with vias 41. Call $d_3$ the smallest dimension of tracks 42 other than the thickness. The cross-section of vias 41, parallel to surface 20, is smaller than that of conductive tracks 42. An insulating layer 44, having a thickness $H_2$, covers surface 20 of insulating layer 18 and conductive tracks 42, 25. On the side of memory MEM, conductive vias 46 extend across the entire thickness $H_2$ of insulating layer 44 and come into contact with conductive tracks 42. On the side of auxiliary circuit CIR, conductive vias 50 extend in insulating layer 44 all the way to tracks 25.

As will be described in further detail hereafter, given that conductive tracks 42 are formed in insulating layer 18 and not on it, minimum dimension $d_3$ of tracks 42 of circuit 40 is smaller than minimum dimension $d_1$ of tracks 24 of circuit 10. When the dimensions of the integrated circuit depend on the minimum dimension of the tracks of memory MEM closest to substrate 14, integrated circuit 40 advantageously has dimensions smaller than those of integrated circuit 10. Further, since tracks 25 of the rest of integrated circuit 40 are made of aluminum, the manufacturing cost of integrated circuit 40 is lower than the manufacturing cost of integrated circuit 12. It is possible to only provide tungsten tracks 42 at the locations of integrated circuit 40 where they may result in a size decrease for the integrated circuit. Advantageously, for a ROM for which tracks 42 generally have the shape of pads with a square or rectangular base, the use of tungsten instead of aluminum for track 42 causes no increase in the series resistance of the assembly formed by a via 46, a track 42, and a via 41 connected in series. Generally, a compromise may have to be made between the space saved due to tracks 42 and the possible series resistance increase due to the use of tungsten instead of aluminum.

The structure of integrated circuit 40 differs from the structures of integrated circuits 10 and 12. Indeed, for circuits 10 and 12, the vias 22, 23, 28, 29, 38, 39 formed in a same insulating layer 18, 26 all have the same length. For circuit 40 and for insulating layer 18, vias 41 of memory MEM are shorter than vias 23 of auxiliary circuit CIR. For insulating layer 44, vias 46 of memory MEM are longer than vias 50 of auxiliary circuit CIR. Further, for circuits 10 and 12, metal tracks 24, 25, 32, 33 are located at distance $H_1$ from substrate 14. For circuit 40, tracks 42 of memory MEM are closer to substrate 14 than metal tracks 25 of auxiliary circuit CIR.

FIGS. 4A to 4E are cross-section views of structures obtained at successive steps of a conventional method for manufacturing integrated circuit 10 of FIG. 1.

Figure 4A:
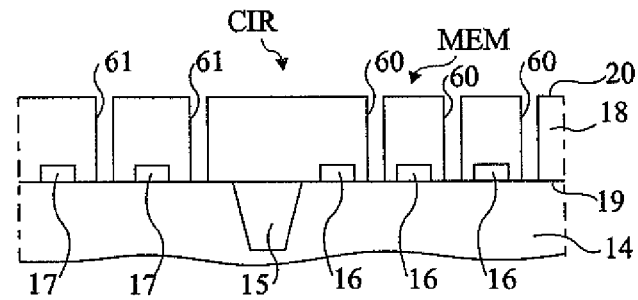
FIGS. 4A to 4E show the structures obtained at successive steps of an example of a method for manufacturing the conventional integrated circuit of FIG. 1.

FIG. 4A shows the structure obtained after the steps of:
forming in substrate 14 insulating region 15 and doped regions, not shown;
forming on substrate 14 semiconductor portions 16, 17;
forming insulating layer 18 covering substrate 14;
forming, in insulating layer 18, openings 60 on the side of memory MEM and openings 61 on the side of auxiliary circuit CIR at the desired locations of vias 22, 23.

Figure 4B:
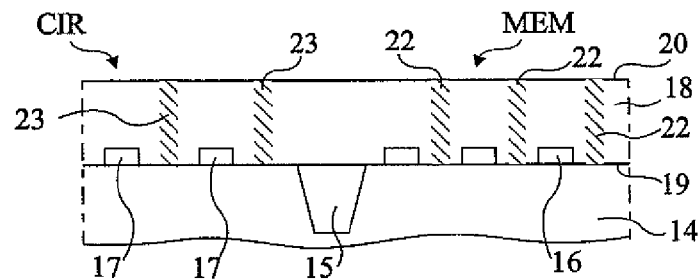

FIG. 4B shows the structure obtained after having filled openings 60 with a conductive material, for example, tungsten, to form vias 22, 23.

Figure 4C:
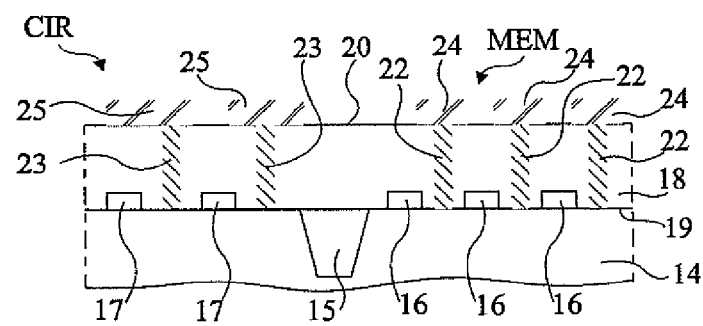

FIG. 4C shows the structure obtained after the steps of:
forming an aluminum layer covering insulating layer 18; and
etching the metal layer to delimit tracks 24, 25.

Figure 4D:
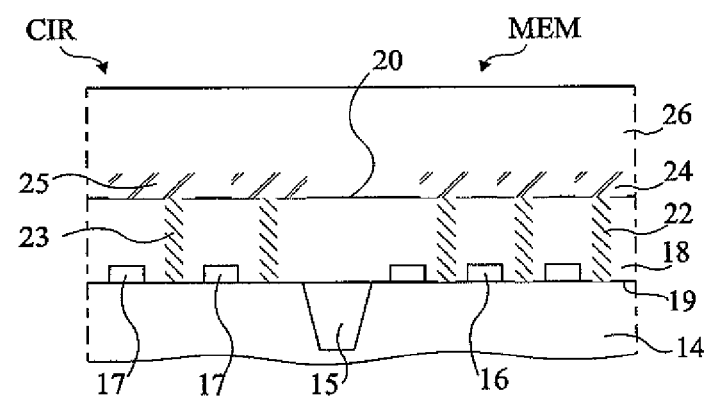

FIG. 4D shows the structure obtained after having formed insulating layer 26, for example, made of silicon oxide, covering metal tracks 24, 25 and insulating layer 18.

Figure 4E:
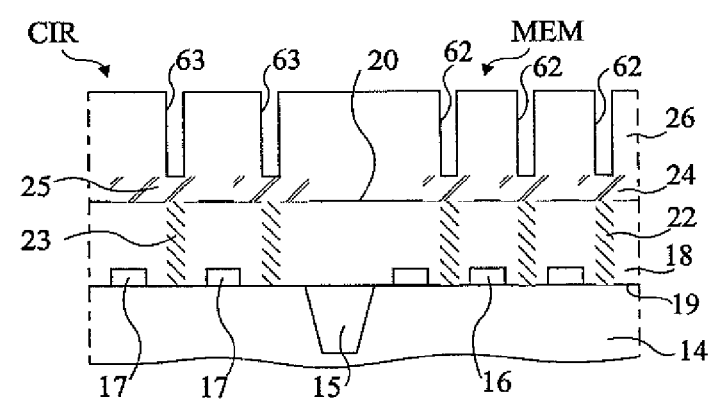

FIG. 4E shows the structure obtained after the forming, in insulating layer 18, of openings 62 on the side of memory MEM and of openings 63 on the side of auxiliary circuit CIR at the desired locations of vias 28, 29.

The last steps of the manufacturing method for obtaining circuit 10 shown in FIG. 1 comprise filling openings 62, 63 with a conductive material, for example, tungsten, to form vias 28, 29. The method may carry on with the forming of metal tracks, possibly made of copper, of upper metallization levels.

FIGS. 5A to 5E are cross-section views of structures obtained at successive steps of an example of a conventional method for manufacturing circuit 12 of FIG. 2. The initial steps are identical to those previously described in relation with FIGS. 4A and 4B.

Figure 5A:
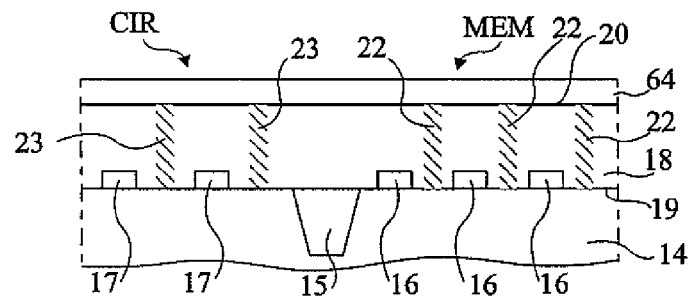
FIGS. 5A to 5E show the structures obtained at successive steps of an example of a method for manufacturing the conventional integrated circuit of FIG. 2.

FIG. 5A shows the structure obtained after having formed an insulating layer 64, for example, made of silicon oxide, covering insulating layer 18.

Figure 5B:
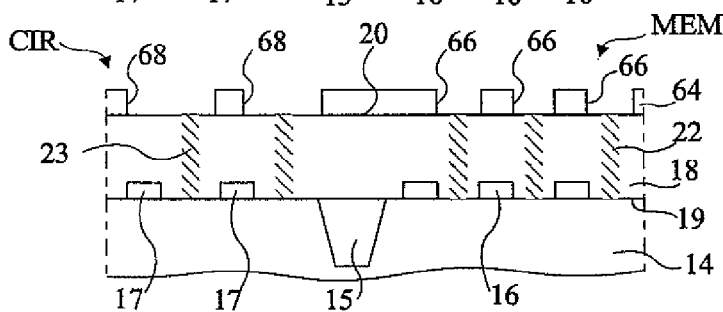

FIG. 5B shows the structure obtained after the forming of openings 66 on the side of memory MEM and of openings 68 on the side of auxiliary circuit CIR at the desired locations of tracks 32, 33.

Figure 5C:
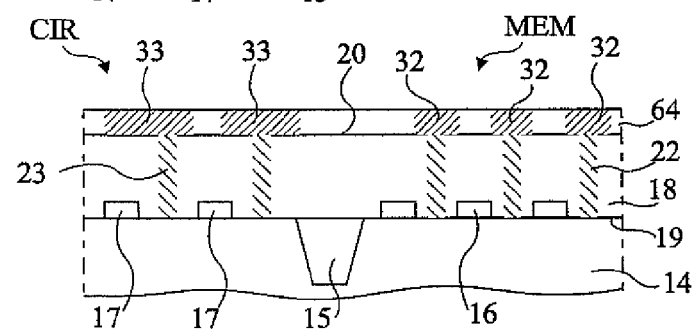

FIG. 5C shows the structure obtained after having filled openings 66, 68 with copper to form tracks 32, 33.

Figure 5D:
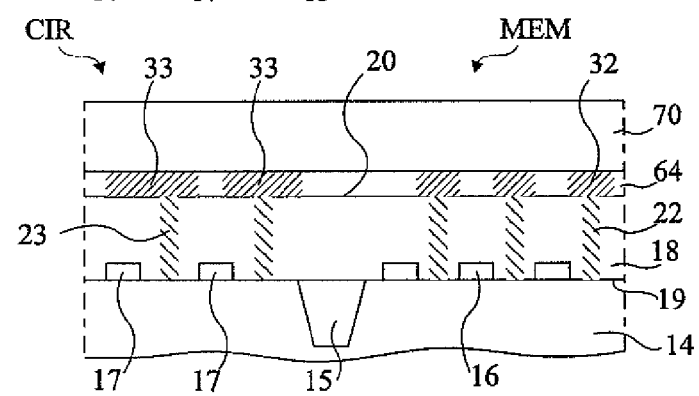

FIG. 5D shows the structure obtained after having formed an insulating layer 70, for example, made of silicon oxide, covering insulating layer 64.

Figure 5E:
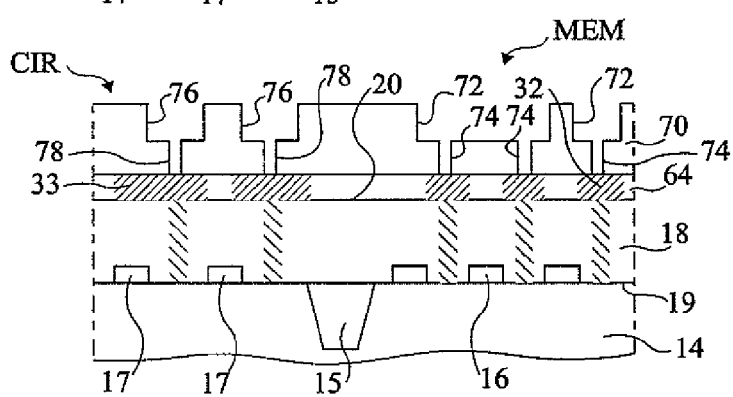

FIG. 5E shows the structure obtained after the forming, on the side of memory MEM, of openings 72 across a portion of the thickness of layer 70 and of narrower openings 74 extending from openings 72 across the rest of the thickness of insulating layer 70 at the desired locations of tracks 36 and of vias 38 and, on the side of auxiliary circuit CIR, of openings 76 extending across a portion of the thickness of layer 70 and of narrower openings 78 extending from openings 76 across the rest of the thickness of insulating layer 70 at the desired locations of tracks 37 and of vias 39.

The last steps of the method for manufacturing circuit 12 shown in FIG. 2 comprise filling openings 72, 74, 76, 78 with copper to form tracks 36, 37 and vias 38, 39. The method may carry on with the forming of copper metal tracks of upper metallization levels.

FIGS. 6A to 6F are cross-section views of the structures obtained at successive steps of a method for manufacturing circuit 40 according to the present invention.

Figure 6A:
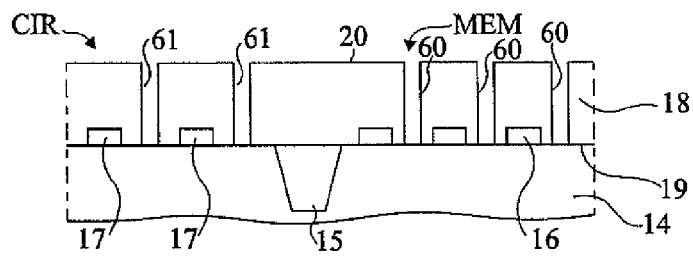
FIGS. 6A and 6F shows structures obtained at successive steps of an example of a method for manufacturing an integrated circuit according to the present invention.

FIG. 6A shows the structure obtained at steps similar to what has been previously described in relation with FIG. 4A. As an example, the forming of openings 60, 61 in insulating layer 18 may be carried out by the steps of:
depositing a photosensitive layer, for example, a resist, on insulating layer 18;
forming openings in the photosensitive layer by photolithography techniques;
forming in insulating layer 18 openings 60, 61 continuing the openings formed in the photosensitive layer, for example, by dry etch; and
removing the photosensitive layer.

Figure 6B:
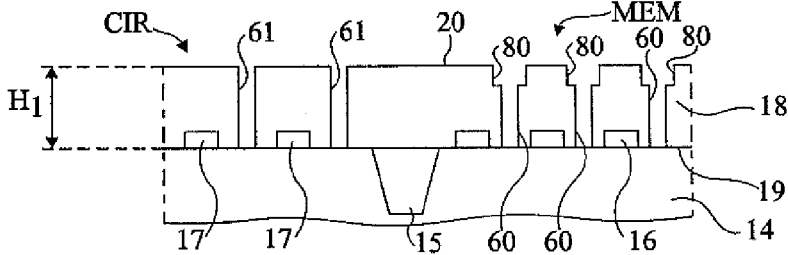

FIG. 6B shows the structure obtained after the forming, on the side of memory MEM, of openings 80 which extend across a portion of thickness $H_1$ of insulating layer 18 at the desired locations of tracks 42. Openings 80 may extend at the level of openings 60. As an example, the forming of openings 80 may comprise the steps of:
depositing a photosensitive layer on insulating layer 18;
forming, by photolithography techniques, openings in the photosensitive layer with dimensions corresponding to metal portions 42 to be formed on the side of memory MEM;
forming in insulating layer 18 openings 80 continuing the openings formed in the photosensitive layer, for example, by dry etch; and
removing the photosensitive layer.

Figure 6C:
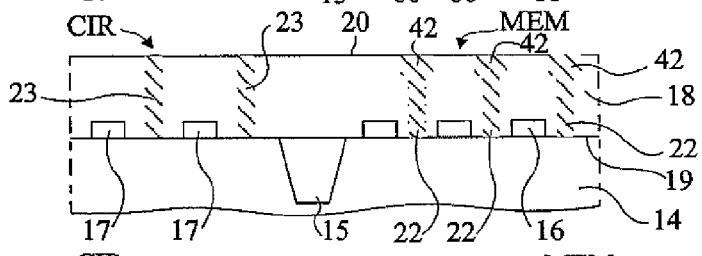

FIG. 6C shows the structure obtained after having filled openings 80, 60, 61 with a conductive material to form vias 22, 23 and conductive tracks 42. This is done, for example, by a chemical vapor deposition or CVD of tungsten over the entire structure, followed by the removal of the tungsten present on insulating layer 18, for example, by a chemical mechanical polishing or CMP step. The deposited tungsten thickness must be sufficient to ensure a proper filling of openings 80.

Figure 6D:
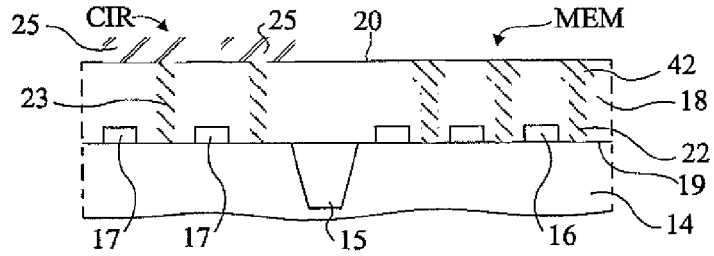

FIG. 6D shows the structure obtained after the steps of:
forming, for example, by vapor deposition, an aluminum layer covering insulating layer 18; and
etching the metal layer to delimit tracks 25 on the side of auxiliary circuit CIR.

As an example, the etching of the metal layer may be carried out by the steps of:
depositing a photosensitive layer, for example, a resist, on the metal layer;
forming openings in the photosensitive layer by photolithography techniques;
forming, in the metal layer, openings, for example, by dry etch, continuing of the openings formed in the photosensitive layer to delimit tracks 25; and
removing the photosensitive layer.

Figure 6E:
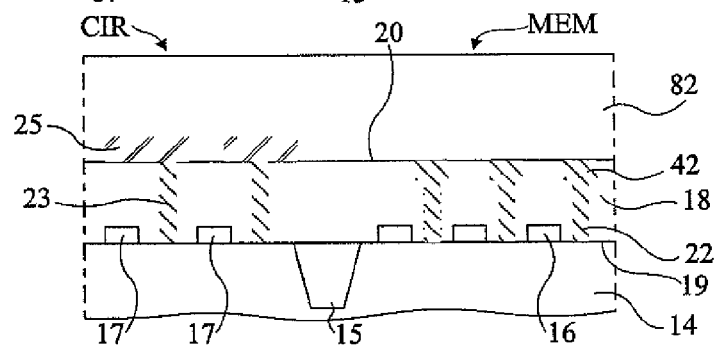

FIG. 6E shows the structure obtained after having formed an insulating layer 82, for example, made of silicon oxide, covering tracks 25, 42 and insulating layer 18.

Figure 6F:
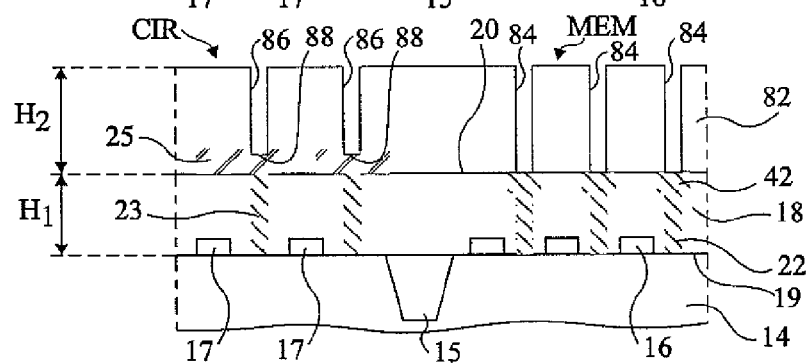

FIG. 6F shows the structure obtained after the forming, in insulating layer 18, of openings 84 on the side of memory MEM and of openings 86 on the side of auxiliary circuit CIR at the desired locations of vias 46, 50.

As an example, the forming of openings 84, 86 in insulating layer 82 may be carried out as follows:

deposition on insulating layer 82 of a photosensitive layer, for example, a resist;

forming of openings in the photosensitive layer by photolithography techniques;

forming, for example, by dry etch, in insulating layer 82, of openings 84, 86 continuing the openings formed in the photosensitive layer, with tracks 25 behaving as an etch stop layer for the etching of openings 86 and tracks 42 behaving as an etch stop layer for the etching of openings 84; and removing the photosensitive layer.

Since the depth of insulating layer 28 to be etched to form openings 84 is greater than that to be etched to form openings 86, the etch process of openings 84, 86 is advantageously strongly selective over the material forming conductive tracks 25. A slight etching 88 of tracks 25 may however be accepted.

The last steps of the method for manufacturing circuit 40 shown in FIG. 3 comprise filling openings 84, 86 with a conductive material to form vias 46, 50. This is done, for example, by a chemical vapor deposition of tungsten over the entire structure, followed by a removal of the tungsten present on insulating layer 82, for example, by a chemical mechanical polishing step. The method may carry on with the forming of metal tracks, possibly made of copper, of upper metallization levels.

As compared with the methods previously described in relation with FIGS. 4A to 4E and 5A to 5E, the manufacturing method example according to the present invention previously described in relation with FIGS. 6A to 6F differs in that two steps of etching insulating layer 18 are carried out on the side of memory MEM while conventional methods provide a only one such step and in that etchings of different depths are performed in insulating layer 44 while conventional methods only provide the simultaneous etching of openings having a same depth.

In the method previously described in relation with FIGS. 4A to 4E, the metal portions 24 which are closest to substrate 14 on the side of memory MEM are formed by the etching of a metal layer covering insulating layer 18. The etching of a metal layer to delimit tracks therein requires delimiting insulated portions in the photosensitive layer covering the insulating layer and corresponding to tracks 24 to be obtained. For usual integrated circuit manufacturing techniques, it appears to be difficult to form portions of small size in the photosensitive layer and to then etch metal portions protected by the small insulated resin portions. According to the present manufacturing method example, on the side of memory MEM, the tracks 42 which are closest to substrate 14 are formed by filling openings 80 formed in insulating layer 18 with a conductive material. The etching of openings in an insulating layer only requires the removal of small portions of the photosensitive layer covering the insulating layer at the locations where the insulating layer must be etched, that is, does not require the forming of small insulated portions in the photosensitive layer. Minimum dimension $d_3$ of tracks 42 of memory MEM of circuit 40 may be smaller than minimum dimension $d_1$ of tracks 24 of circuit 10. Further, for circuit 40, given that portions 25 of the rest of the integrated circuit are made of aluminum, the manufacturing cost of circuit 40 is lower than the manufacturing cost of circuit 12.

Specific embodiments of the present invention have been described. Various alterations and modifications will occur to those skilled in the art. In particular, although in the previously-described example, tracks 42 and vias 41 are made of tungsten, it should be clear that they might be made of another material. As an example, it might be a tungsten-based alloy. Similarly, although in the previously-described example, tracks 25 are made of aluminum, it should be clear that they may be made of another material, for example, an aluminum-based alloy. Further, only those elements necessary to the understanding of the present invention have been described. In particular, the use of a bonding layer or of a protection layer conventionally provided in the manufacturing of an integrated circuit has not been described.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising an insulating layer having first and second opposite surfaces, comprising:
   in a first area, first conductive portions of a first tungsten-based conductive material, located in the insulating layer, flush with the first surface and continued by first vias of the first conductive material of smaller cross-section and extending to the second surface; and
   in a second area, second conductive portions of a second aluminum-based conductive material arranged on the first surface and second vias of the first tungsten-based conductive material, in contact with the second conductive portions and extending from the first surface to the second surface.

2. The circuit of claim 1, wherein the minimum dimension parallel to the first surface of the first conductive portions is smaller than the minimum dimension parallel to the first surface of the second conductive portions.

3. The circuit of claim 1, wherein the first vias have a first length and wherein the second vias have a second length greater than the first length.

4. The circuit of claim 1, further comprising:
   an additional insulating layer comprising third and fourth opposite surfaces and covering, on the third surface side, the first and second conductive portions and the insulating layer;
   third vias having a third length and extending from the fourth surface to the third surface in contact with the first conductive portions; and
   fourth vias having a fourth length strictly smaller than the third length and connecting the second conductive portions to the fourth surface.

5. The circuit of claim 1, wherein the first area corresponds to a ROM-type non-volatile memory area.

6. The circuit of claim 1, comprising a substrate and wherein said insulating layer covers the substrate on the side of the second surface.

7. A method for manufacturing an integrated circuit comprising the steps of:
   providing an insulating layer having first and second opposite surfaces;
   forming, in a first area of the integrated circuit, first conductive portions of a first tungsten-based conductive material, located in the insulating layer, flush with the first surface and continued by first vias of the first conductive material of smaller cross-section and extending to the second surface; and
   forming, in a second area of the integrated circuit, second conductive portions of a second aluminum-based conductive material arranged on the first surface and second vias of the first tungsten-based conductive material, in contact with the second conductive portions and extending from the first to the second surface.

8. The method of claim 7, comprising the steps of:
forming in the first surface of the insulating layer first openings having the dimensions of the first conductive portions and extending across a portion of the thickness of the insulating layer;
forming in the insulating layer second openings having the dimensions of the first vias and extending form the first openings to the second surface;
forming in the insulating layer third openings having the dimensions of the second vias and extending from the first surface to the second surface; and
filling the first, second, and third openings with the first material.

* * * * *